United States Patent [19]

Merrill et al.

[11] 4,326,192

[45] Apr. 20, 1982

[54] SEQUENTIAL SUCCESSIVE APPROXIMATION ANALOG-TO-DIGITAL CONVERTER

[75] Inventors: Richard B. Merrill, Hamden, Conn.; Lewis M. Terman, South Salem; Yen S. Yee, White Plains, both of N.Y.

[73] Assignee: International Business Machines Corporation, Armonk, N.Y.

[21] Appl. No.: 47,557

[22] Filed: Jun. 11, 1979

[51] Int. Cl.³ .............................................. H03K 13/08
[52] U.S. Cl. ........................ 340/347 AD; 307/221 D; 340/347 M; 357/24
[58] Field of Search .................. 340/347 M, 347 AD; 357/24; 307/221 D, 304

[56] References Cited

U.S. PATENT DOCUMENTS

| | | | |
|---|---|---|---|
| 3,100,298 | 8/1963 | Fluhr | 340/347 AD |
| 3,156,913 | 11/1964 | Crocker et al. | 340/347 AD |
| 3,701,148 | 10/1972 | Frei | 340/347 M X |
| 3,930,255 | 12/1975 | Means | 340/347 M X |
| 4,072,938 | 2/1978 | Buchanan | 340/347 AD |
| 4,072,939 | 2/1978 | Heller et al. | 340/347 M X |
| 4,107,670 | 8/1978 | Hornak | 340/347 DA |
| 4,126,852 | 11/1978 | Baertsch | 364/606 X |

OTHER PUBLICATIONS

The Engineering Staff of Analog Devices, Inc., Analog-Digital Conversion Handbook, 6/1972, pp. II-46 to II-48.

*Primary Examiner*—Thomas J. Sloyan
*Attorney, Agent, or Firm*—Graham S. Jones, II

[57] ABSTRACT

A pipelined analog-to-digital (A/D) conversion system enhances the effective data rate of the converter in direct proportion to the number of stages in the pipeline. The pipelined A/D converter operates in conjunction with a charge-coupled device (CCD) multilevel storage (MLS) in a three-bit (eight-level) implementation. Three comparators are used in the three-bit system arranged in a sequential successive approximation configuration with control circuits and a CCD shift register.

1 Claim, 9 Drawing Figures

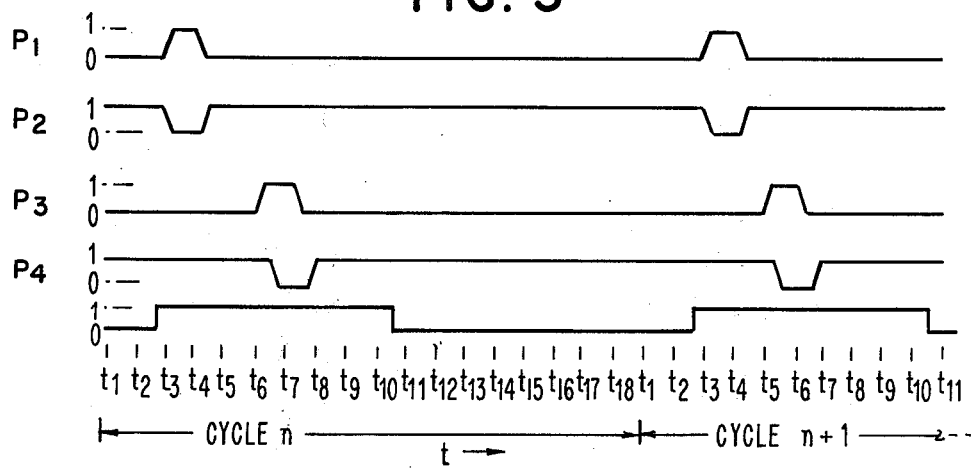
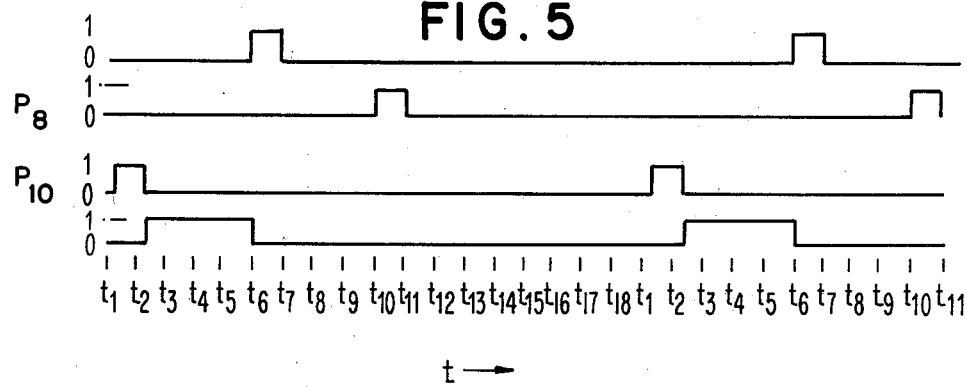
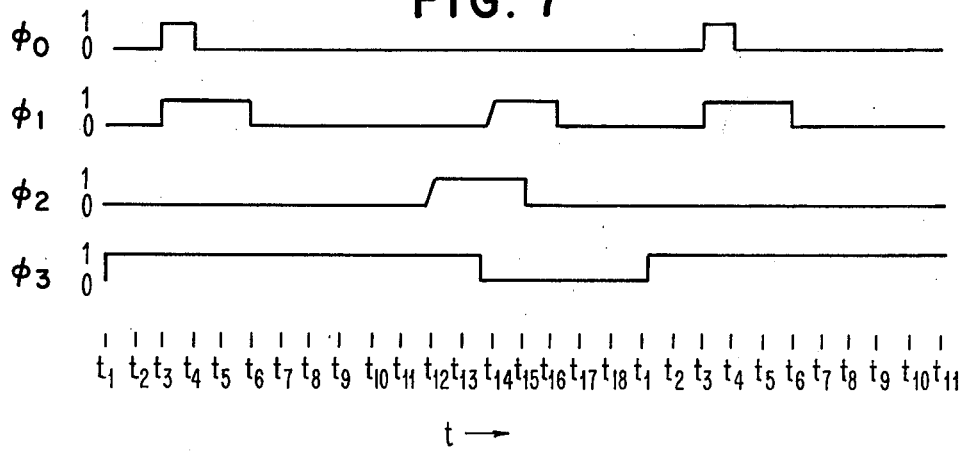

SEQUENTIAL SUCCESSIVE APPROXIMATION ANALOG-TO-DIGITAL CONVERTER

DESCRIPTION

Technical Field

This invention relates to a pipelined, sequential successive approximation analog-to-digital converter. More particularly, this invention relates to such a converter as adapted to convert analog data stored in a charge-coupled device (CCD) multilevel storage (MLS) memory into the corresponding binary signals.

An object of this invention is to provide an improved data conversion system.

Another object of this invention is to provide an improved CCD multilevel storage to binary data conversion system.

Background Art

U.S. Pat. No. 3,968,486 issued July 6, 1976 to Gerdes on an application filed June 20, 1974 describes an electronic analog-to-digital converter utilizing a plurality of analog comparators, all comparators receiving a common analog input and separate respective reference voltages for comparison. The outputs of the comparators provide respectively the digital word output of the analog-to-digital converter wherein the output state of the comparators are dependent upon the output state of the higher order comparators and where the resolution of the analog-to-digital converter is dependent on the number of stages of comparators utilized. The reference voltage for the least significant digital bit is determined by all the higher order digital outputs. The analog-to-digital converter disclosed is of the asynchronous type not requiring a clock signal and the total analog-to-digital conversion time is $nT_c$, where n is the number of comparator stages and $T_c$ is the response time of an individual comparator.

The analog-to-digital converter of the present invention is different from the system of the patent in that one input (not common) is applied to the first comparator, the disclosed system employs charge packets rather than analog voltages though not restricted to such, and the output states of the disclosed comparators are not dependent on the output state of the higher order comparator in the same manner as shown in the Gerdes patent. Also, at any given time each stage of the pipelined system is decoding a different analog input quantity. In addition, the analog quantities to be decoded are periodically shifted from one stage to the next down the pipeline.

Additional prior art includes Klein, "Successive-Approximation Analog-to-Digital Converter Using Josephson Devices," U.S. Pat. No. 3,949,395; Means, "Analog to Digital Conversion by Charge Transfer Device," U.S. Pat. No. 3,930,255; Waehner, "Bipolar A/D Converter Using Two Comparators," U.S. Pat. No. 3,982,240; Fletcher, "Analogue to Digital Converters," U.S. Pat. 3,967,269; Smith, "Charge Transfer Device Decoder and Compander," U.S. Pat. No. 3,903,543; Ailen, "Successive Approximation Analog to Digital Converter," U.S. Pat. No. 3,964,061; Sandford, "Digital to Analog Converter," U.S. Pat. No. 3,967,272; and Pastoriza, "Integrated-Circuit; Digital-to-Analog Converter," U.S. Pat. No. 3,978,473. Patents which relate to CCD devices include Elmer et al, "Multiphase Series-Parallel-Series Charge-Coupled Device Registers," U.S. Pat. No. 4,008,446; Barton et al, "Isolation Element CCD Serial-Parallel-Serial Analog Memory," U.S. Pat. No. 3,914,748; Ert, "Serial-Parallel-Serial CCD Memory with Interlaced Storage," U.S. Pat. No. 3,914,077; Boyle et al "Information Storage Devices," U.S. Pat. No. 3,858,232; Merrill et al, "Loop Organized Serial-Parallel-Series Memory Storage System," U.S. Pat. No. 4,130,894; and Heller et al, U.S. patent application Ser. No. 785,723, filed Apr. 7, 1977 for a "Charge Transfer Device Differencing Circuit"; Yee, "Adaptive Leakage Compensation for CCD," IBM Technical Disclosure Bulletin 21, No. 5, 2144–2145 (1978). A circuit for comparing the magnitude of CCD charge packets is described in Terman et al, "High Sensitivity Charge Comparator for Sensing and Comparing Very Small Charge Packets," IBM Technical Disclosure Bulletin 21, No. 3, 1262-3 (1978).

BRIEF DESCRIPTION OF THE DRAWINGS

FIG. 3 is a timing diagram with the vertical axes indicating whether a clock pulse is up or down (on or off and where "up" is the "1" level and down is the "0" level).

FIG. 5 is a timing diagram of additional clock pulses adapted to control the pipeline of FIG. 4.

FIG. 7 is a timing diagram for the pulses in FIG. 6 which is analogous and in addition to FIGS. 3 and 5 above. FIGS. 3, 5, and 7 are all drawn to the same time scale and are divided into separate figures simply to provide a simpler presentation of the timing data for easier understanding.

DISCLOSURE OF INVENTION

Figure 1:
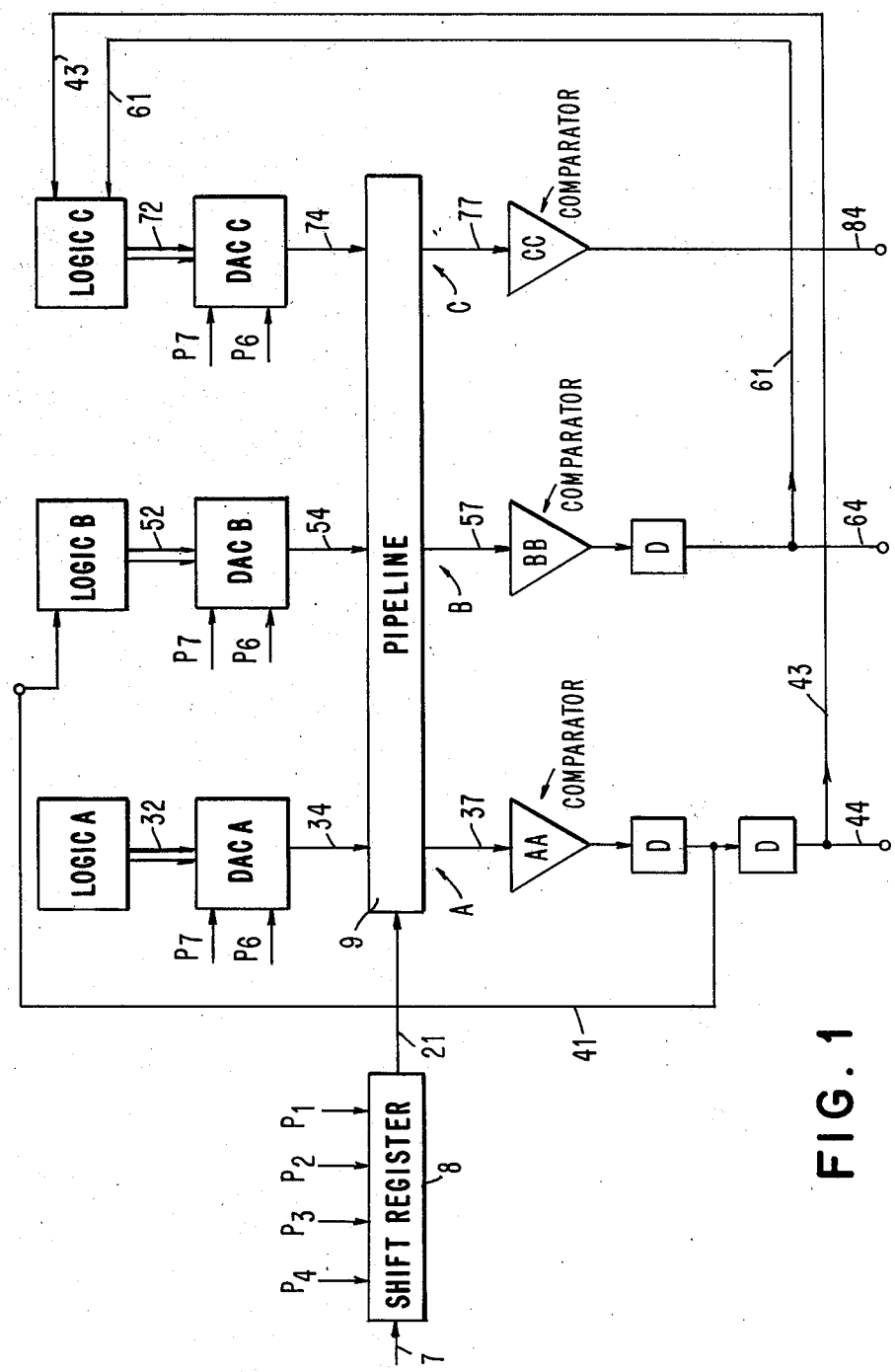
FIG. 1 shows a block diagram of a pipelined, sequential successive approximation analog-to-digital converter implemented by CCD and MOSFET technologies on the same substrate.

FIG. 1 shows a block diagram of a pipelined, sequential successive approximation analog-to-digital converter implemented by means including "Charge Coupled Device" and "MOS Field Effect Transistor" (MOSFET) technologies which are made on the same substrate.

Assuming n-channel technology for purposes of illustration a four-phase CCD shift register 8 receives data at input 7 in the form of "charge packets" Q comprised of minority carriers (electrons). Flow of data through the shift register 8 is controlled by pulses from the repetitive, sequential phase, clock pulse sources $P_1$-$P_4$ in a manner well known to those versed in the art. The clock pulses move the charge packets Q towards output 21 for introduction into a pipeline circuit 9. Pipeline circuit 9 is a modified CCD shift register which is adapted to present the charge packets Q for measurement of their charge magnitude by a sequential successive approximation method. The method is performed by presenting each charge packet Q first to a comparator AA at position A, then to comparator BB at position B, and finally to comparator CC at position C sequentially in time. This process is pipelined in the sense that, for example, comparator AA is able to work on measuring the third packet $Q_3$ while comparators BB and CC are still working on the second packet $Q_2$ and the first packet $Q_1$ respectively.

The analog-to-digital conversion process of a given charge packet $Q_1$ will be explained first. Assume that the value of charge packet $Q_1$ is defined to vary from a minimum fractional value of 0 to a maximum fractional value of 1. Assume also that the charge packet will be decoded into a three-bit (eight level) representation. Packet $Q_1$ first moves from position 21 to position A in pipeline circuit 9. Then the highest order comparator AA receives an input signal proportional to the value of the charge $Q_1$ on line 37. A reference charge value of $\frac{1}{2}$ is supplied to comparator AA from DAC A on line 34 which supplies it to pipeline 9. Pipeline 9 provides to comparator AA a proportional signal with the same proportionality as for the charge packet $Q_1$. Comparator AA compares the unknown charge packet $Q_1$ and the reference charge packet of functional value $\frac{1}{2}$, and produces a binary "1" or "0" signal which appears on lines 41 and 43 with delays introduced by delay circuits D. The signals on lines 41 and 43 to indicate the most significant bit in the three bit binary representation of the analog charge packet $Q_1$.

After the above comparison, packet $Q_1$ moves to position B. Subsequently DAC B supplies the value of $\frac{1}{4}$ or $\frac{3}{4}$ through line 54 to the pipeline circuit 9 in analogous fashion to DAC A. The comparison by comparator AA on packet $Q_1$ in the previous cycle determines whether $\frac{1}{4}$ or $\frac{3}{4}$ is to be produced by DAC B. A proportional signal is then supplied to comparator BB which is used to determine the next most significant bit of packet $Q_1$.

The output of comparator AA is binary, i.e., a "1" or "0". If the value of the charge packet $Q_1$ is greater than $\frac{1}{2}$, the output of the comparator AA is "1". Otherwise, it is "0". After a delay time D required for the packet $Q_1$ to move into position B in the pipeline circuit 9, logic B receives the output signal on line 41. If the binary value is "1", DAC B is set via line 52 to emit a charge value of $\frac{3}{4}$ to comparator BB as the reference signal for the charge packet $Q_1$ at position B. Alternatively, if the output of comparator AA for charge packet $Q_1$ was "0", then logic B is caused to set DAC B on line 52 to emit a charge value of $\frac{1}{4}$ on line 54 to comparator BB.

Comparator BB compares the signal charge packet value $Q_1$ with the reference charge packet value from DAC B, which is either $\frac{1}{4}$ or $\frac{3}{4}$. If the value of $Q_1$ is greater than the charge value from DAC B, then a "1" output on line 61 is produced after a delay D; if it is less a "0" output is produced. This output is the "next most significant bit" (NMSB) in the three bit binary representation of the analog charge packet $Q_1$. Charge packet $Q_1$ is now moved to position C in the pipeline circuit 9. At this point, the process performed previously by the other comparators is repeated in an analogous fashion. The inputs on lines 43 and 61 cause logic C to generate a value of either $\frac{1}{8}$, $\frac{3}{8}$, $\frac{5}{8}$, or $\frac{7}{8}$. If lines 43 and 61 are both "1's", then the DAC C will be set to $\frac{7}{8}$ by logic C. The remaining permutations are explained in Table I which reads as follows:

TABLE I

|  |  | line 43 | |
|---|---|---|---|
|  |  | "1" | "0" |
| line 61 | "1" | $\frac{7}{8}$ | $\frac{3}{8}$ |
|  | "0" | $\frac{5}{8}$ | $\frac{1}{8}$ |

The comparison of charge $Q_1$ with the reference charge packet value from DAC C via line 74 is made by the comparator CC. The output of comparator CC is presented on line 84 as a "0" or a "1." The signal on the line indicates the value of the "least significant bit" (LSB) in the three-bit binary representation of the analog charge packet $Q_1$.

The binary value of the signals at points 44, 64 and 84 from the delay units to line 44, unit D to line 64, and from comparator CC directly to line 84 at that time indicates the three-bit binary representation of charge $Q_1$. If charge $Q_1$ produced positive values from all three comparators AA, BB and CC, then the output will be all "1's" indicating a value of $\frac{7}{8}$. The fractional to three-bit binary conversion Table II is as follows:

TABLE II

| FRACTIONAL VALUES | THREE-BIT BINARY VALUES LINES | | |
|---|---|---|---|
|  | 44 | 64 | 84 |
| $\frac{7}{8}-1.0$ | "1" | "1" | "1" |
| $\frac{3}{4}-\frac{7}{8}$ | "1" | "1" | "0" |
| $\frac{5}{8}-\frac{3}{4}$ | "1" | "0" | "1" |
| $\frac{1}{2}-\frac{5}{8}$ | "1" | "0" | "0" |
| $\frac{3}{8}-\frac{1}{2}$ | "0" | "1" | "1" |
| $\frac{1}{4}-\frac{3}{8}$ | "0" | "1" | "0" |
| $\frac{1}{8}-\frac{1}{4}$ | "0" | "0" | "1" |
| $0-\frac{1}{8}$ | "0" | "0" | "0" |

In actual practice, more bit positions can be employed as will be obvious to one having ordinary skill in the art, but this structure suffices for purposes of explanation.

Best Mode for Carrying out the Invention

Figure 2A:
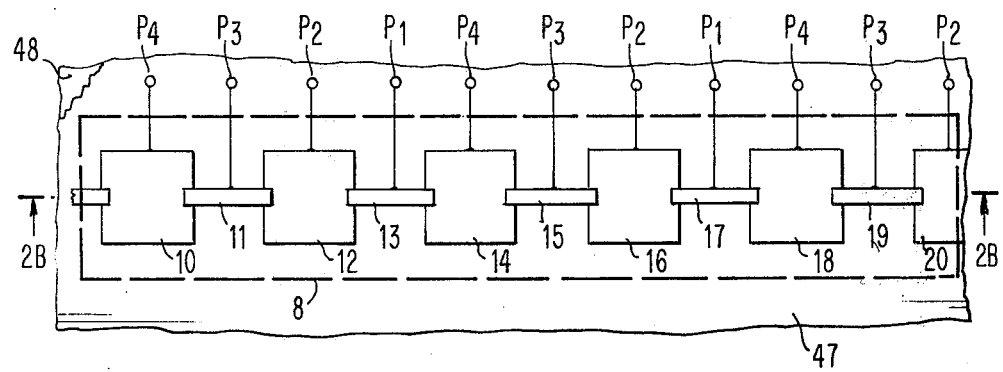
FIG. 2A shows a plan view of the structure of the shift register shown in FIG. 1.
Figure 2B:
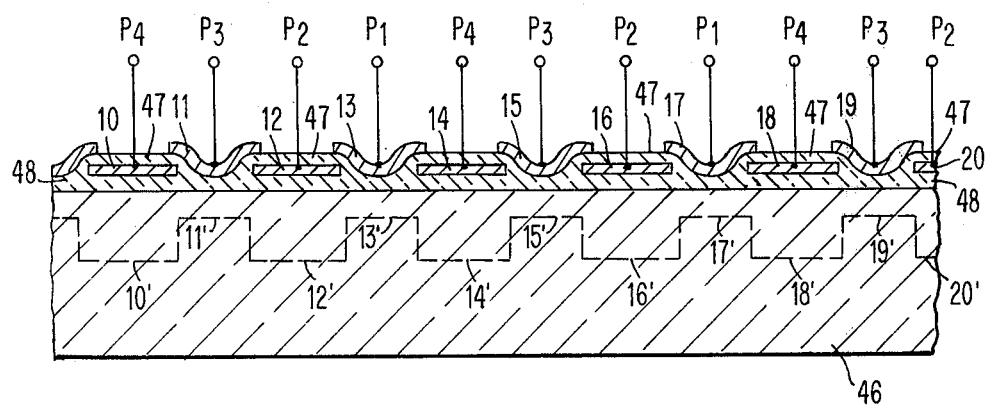
FIG. 2B shows a sectional view of the shift register of FIG. 2A taken along line 2B—2B in FIG. 2A.

FIG. 2A shows a plan view of shift register 8 in FIG. 1. A number of storage electrodes 10, 12, 14, 16, 18, and 20 composed of a conductive material, such as polysilicon, are formed over a thin layer of oxide 48 on a silicon chip 46, as can be seen in FIG. 2B, which is a sectional view taken along line FIG. 2B—FIG. 2B in FIG. 2A. The polysilicon storage electrodes 10, 12, 14, 16, 18 and 20 are connected alternately to receive clock pulses from lines $P_4$ and $P_2$ as indicated. The substrate 46 is composed of P-type semiconductor material (with n-channel technology used for purposes of illustration). Covering the electrodes 10, 12 . . . 18 and 20 is a thin insulating layer of silicon dioxide 47 serving to support and insulate an additional second layer of transfer electrodes. The transfer electrodes 11, 13, 15, 17 and 19 are also composed of a material such as polysilicon, and they are connected alternately to receive either one of clock pulses $P_3$ and $P_1$, as indicated. Transfer electrodes 11, etc. are deposited upon the silicon oxide layer 47 with their ends overlapping the adjacent edges of the storage electrodes 10 and 12, 12 and 14, 14 and 16, 16 and 18, 18 and 20 respectively, in the well known overlapping type of structure for CCD transfer electrodes.

A charge-coupled device is essentially an assembly of transfer electrodes interconnected in a periodic manner, which, when properly pulsed, produce a moving array of potential wells. The propagation of charge packets in such a moving array of potential wells is well-known by one skilled in the art.

Assume that a packet of charge $Q_1$ composed of electrons is stored in potential well 10' shown in phantom in FIG. 2B beneath storage electrode 10. It is desired to propagate the charge packet $Q_1$ along through the shift register 8. If the potentials on electrodes 11 and 12 are raised, potential wells 11' and 12' are created under electrodes 11 and 12. When potential on electrode 10 is then lowered, charge from charge packet $Q_1$ will flow from well 10' through transfer region 11' beneath the transfer electrode 11 into the charge well 12' formed beneath the larger storage electrode 12. If the potential on the transfer electrode 11 is dropped subsequently, then the entire packet of charge $Q_1$ is transferred into the storage well 12' beneath storage electrode 12.

FIG. 3 is a timing diagram with the vertical axes indicating when a clock pulse is up (on) or down (off). When the clock pulse is on, the line rises to its higher value. When it is off, the pulse drops to its lower value. Assume that the charge packet $Q_1$ starts in well 10' at time $t_5$. Just after time $t_6$, $P_3$ rises briefly followed by a short drop of $P_4$ for most of the time from $t_6$ to $t_8$. Thus the charge packet $Q_1$ moves to the right under transfer electrode 11. Note that electrode 12 is under the control of $P_2$ which is at a positive value so a portion of packet $Q_1$ moves under electrode 12 into well 12'. Halfway from $t_7$ to $t_8$, $P_3$ drops forcing the remainder of packet $Q_1$ to move into charge well 12'.

On the next cycle of the pulse train $P_2$, after time $t_3$, $P_2$ drops to a potential low enough to empty well 12'. At the same time $P_1$ is up ($t_3$) raising the potential on transfer electrode 13. Further, $P_4$ is up, so $Q_1$ flows into well 14' via transfer region 13'. At time $t_4$, $P_1$ drops again and transfer region 13' empties as the remaining charge flows into well 14'. One complete cycle of movement of a charge packet under the control of $P_3$, $P_4$, $P_1$, and $P_2$ has been described.

The process of charge transfer repeats itself in the sense that electrode 14 is analogous to electrode 10, 15 to 11, 16 to 12, and 17 to 13, and so forth because they are attached to the same respective clock pulse lines. After time $t_6$, $P_3$ rises to permit the flow of $Q_1$ from well 14' through transfer region 15' which flows readily into well 16' because the voltage of $P_2$ is up at time $t_6$. At the same time additional charge packets $Q_n$, $Q_{n-1}$, $Q_{n-2}$ are moving from well 10' to well 12', well 18' to 20', etc., under the control of the same clock pulses. With this type of CCD arrangement, it is necessary to keep the successive charge packets $Q_1$, $Q_2$, ... $Q_n$ moving through the shift register separated from each other by a potential barrier such as the regions 11', 13', 15', 17' and 19' beneath electrodes connected to $P_3$ and $P_1$. Thus, wells 10', 14' and 18' can be filled with packets $Q_3$, $Q_2$, and $Q_1$ respectively which had come from position 7 into shift register 8. At the same time, wells 12', 16' and 20' are necessarily empty to facilitate transfer of packets. Well 20' is empty awaiting the arrival of packet $Q_1$ a moment later when pulse trains $P_2$ and $P_3$ are positive and $P_4$ drops. Well 16' is awaiting $Q_3$ and well 12' is awaiting $Q_3$. In other words, at any given time looking at any two adjacent wells, one of the two should be filling or full and the other should be empty or emptying as the charge packets move from left to right.

Figure 4:
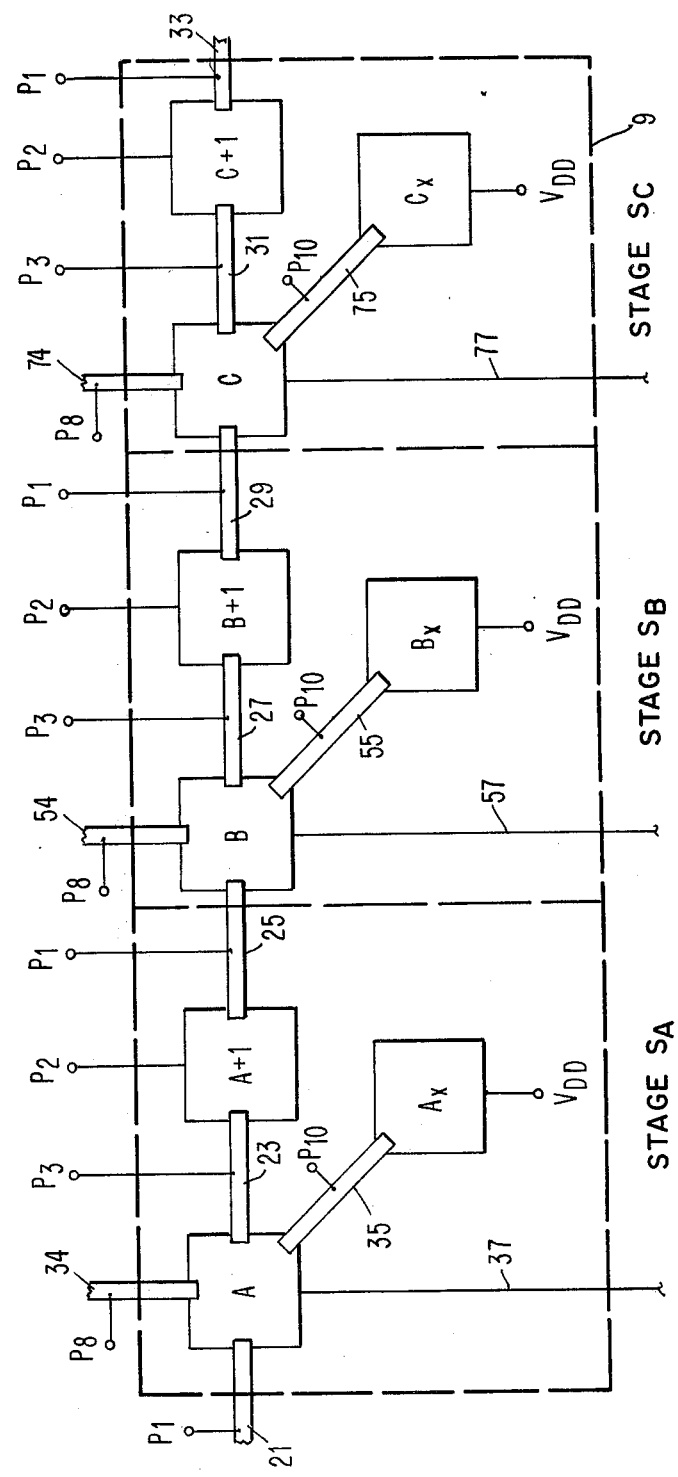
FIG. 4 is a schematic plan view of the pipeline circuit shown in FIG. 1 implemented in CCD devices.

FIG. 4 shows a schematic plan view of the CCD structure within the pipeline circuit 9 of FIG. 1. The pipeline circuit 9 in FIG. 1 consists of three operationally identical stages $S_A$, $S_B$, and $S_C$. A, A+1, B, B+1, C, and C+1 are storage electrodes and 21, 23, 25, 27, 29 and 31 are transfer electrodes laid out in a manner similar to the alternated transfer and storage regions shown in FIG. 2A.

In stage $S_A$, transfer electrode 21 from shift register 8 extends to a storage electrode A. Storage electrode A is connected by a transfer electrode 34 to DAC A (FIG. 1) for receipt of charge packets $Q_{DAC\ A}$ from DAC A when pulse source $P_8$ is up (as in FIG. 5 from time $t_{10}$ to $t_{11}$). Storage electrode A has a thin film at metalization 37 connected to it to conduct the voltage thereon to comparator AA. Transfer electrodes 23 and 25 and intermediate storage electrode A+1 are connected in the same fashion as transfer electrodes 11 and 13 and storage electrode 12 in shift register 8 in FIGS. 2A and 2B. The intermediate storage electrode A+1 serves the purpose of storing a charge packet such as $Q_n$ in the potential well (A+1)' below intermediate storage electrode A+1 during the interval of time from $t_8$ of a given cycle to $t_3$ of the next cycle, whereupon pulse train $P_1$ goes on and pulse train $P_2$ goes off, causing the charge packet to be moved out from under storage electrode (A+1). Storage electrode A is also coupled to a transfer electrode 35 for the purpose of transferring charge from storage well A' to diffused region $A_x$ when pulse train $P_{10}$ is on. Diffused region $A_x$ is connected to a supply voltage $V_{DD}$. Pulse train $P_{10}$ is sufficiently positive in the on condition that the associated potential well 35' below transfer electrode 35 is more positive (lower potential for electrons) than the most positive level that potential well A' below storage electrode A can achieve, and supply $V_{DD}$ is sufficiently positive that diffused region $A_x$ is always more positive than potential well 35'. As a result any charge residing in potential well A' when pulse train $P_{10}$ goes on will be attracted to the most positive potential, and will move to diffusion $A_x$ by way of potential well 35', and be removed by the power supply $V_{DD}$. Thus, when pulse train $P_{10}$ goes on, all charge in potential well A' will be removed.

Storage electrode A+1 is connected by transfer electrode 25 to electrode B of the succeeding stage $S_B$, which is analogous to transfer electrode 21.

The operation of stage $S_A$ is as follows: at time $t_2$, the beginning of an operational cycle, a charge packet $Q_1$ is in the last well 20' of shift register 8, and the previous charge packet from shift register 8 $Q_0$ is in potential well (A+1)' below storage electrode (A+1). Storage electrode A is precharged to a voltage level by the comparator AA via interconnection 37. From $t_3$ to $t_5$ the result of pulse trains $P_1$ and $P_2$ is to cause charge packet $Q_1$ to move to potential well A', and to cause charge packet $Q_0$ to move to potential well B' in the next stage.

At time $t_5$, storage electrode A is made electrically "floating" at potential $V_A$. That is, it is disconnected from any D.C. potential. When "floating", the potential of storage electrode A will vary in response to changes in the charge condition in the corresponding well A' beneath electrode A. The voltage on electrode A is still conducted to comparator AA via interconnection 37.

Between time $t_6$ and $t_8$, the effect of pulse trains $P_3$ and $P_4$ is to cause all charge in potential well A to be moved from beneath electrode A to beneath storage electrode A+1. This requires that the potential well 23' under transfer electrode 23 be sufficiently positive that all charge in packet $Q_1$ in potential well A' will drain out of A' when pulse train $P_3$ is on, and pulse train $P_2$ must be sufficiently positive that all charge in packet $Q_1$ will go under storage electrode (A+1) when pulse train $P_3$ goes off subsequently.

As a result of the removal of charge packet $Q_1$ from potential well A', a positive voltage change $\Delta V_1$ proportional to $Q_1$ is induced on floating electrode A. At time $t_8$ electrode A remains floating at its new potential $V_A + \Delta V_1$.

Beginning at time $t_{10}$ a reference charge packet $Q_{DAC\ A}$, from DAC A, is moved under floating electrode A in a manner analogous to that described previously when pulse train $P_8$ goes off at time $t_{11}$. This induces a negative voltage change $\Delta V_{DAC\ A}$, proportional to $Q_{DAC\ A}$, on floating electrode A. At time $t_{11}$ electrode A is floating at a potential given by $$V_A + \Delta V_1 - \Delta V_{DAC\ A}$$

At time $t_{12}$ comparator AA is pulsed to determine if the net difference voltage induced on electrode A is positive or negative; i.e., if $\Delta V_1 - \Delta V_{DAC\ A}$ is greater or less than zero. If it is greater than zero, $Q_1$ is greater than $Q_{DAC\ A}$, and if it is less than zero, $Q_1$ is less than $Q_{DAC\ A}$.

After comparator A has compared $Q_1$ and $Q_{DAC\ A}$, at time $t_1$ pulse train $P_{10}$ goes on causing the charge $Q_{DAC\ A}$ under electrode A to be transferred to diffusion $A_x$ and to be removed by the power supply $V_{DD}$. The comparison cycle concludes with charge packet $Q_1$ in potential well (A+1)', the next charge packet $Q_2$ in potential well 20' in the last stage of shift register 8, and the comparator indicating whether $Q_1$ was greater than or less than the reference charge packet $Q_{DAC\ A}$ from DAC A. At the beginning of the next cycle, packet $Q_1$ is moved into storage well B' in stage B and charge packet $Q_2$ is moved into storage well A' in stage A.

As can be seen from FIG. 4, stages $S_B$ and $S_C$ are operationally identical with stage $S_A$. Thus, simultaneous with the operations of moving charge packet $Q_1$ and comparing it to a reference charge packet from DAC A, the previous charge packet $Q_0$ is moved and compared to a reference charge packet from DAC B in stage $S_B$, and the next previous charge packet $Q_{-1}$ is moved and compared to a reference charge packet from DAC C. In this manner the pipelined analog-to-digital conversion as described in conjunction with FIG. 1 is accomplished. Additional stages beyond C can be added to obtain addition resolution in the analog-to-digital conversion.

After a charge packet has gone through the pipeline, it is conducted out of the pipeline via a transfer electrode, such as electrode 33 in stage C for the three stage case, to a diffused region (not shown in FIG. 4) connected to a high positive voltage, analogous to regions $A_x$, $B_x$ and $C_x$ in FIG. 4, where the charge is removed to the voltage supply.

Figure 8:
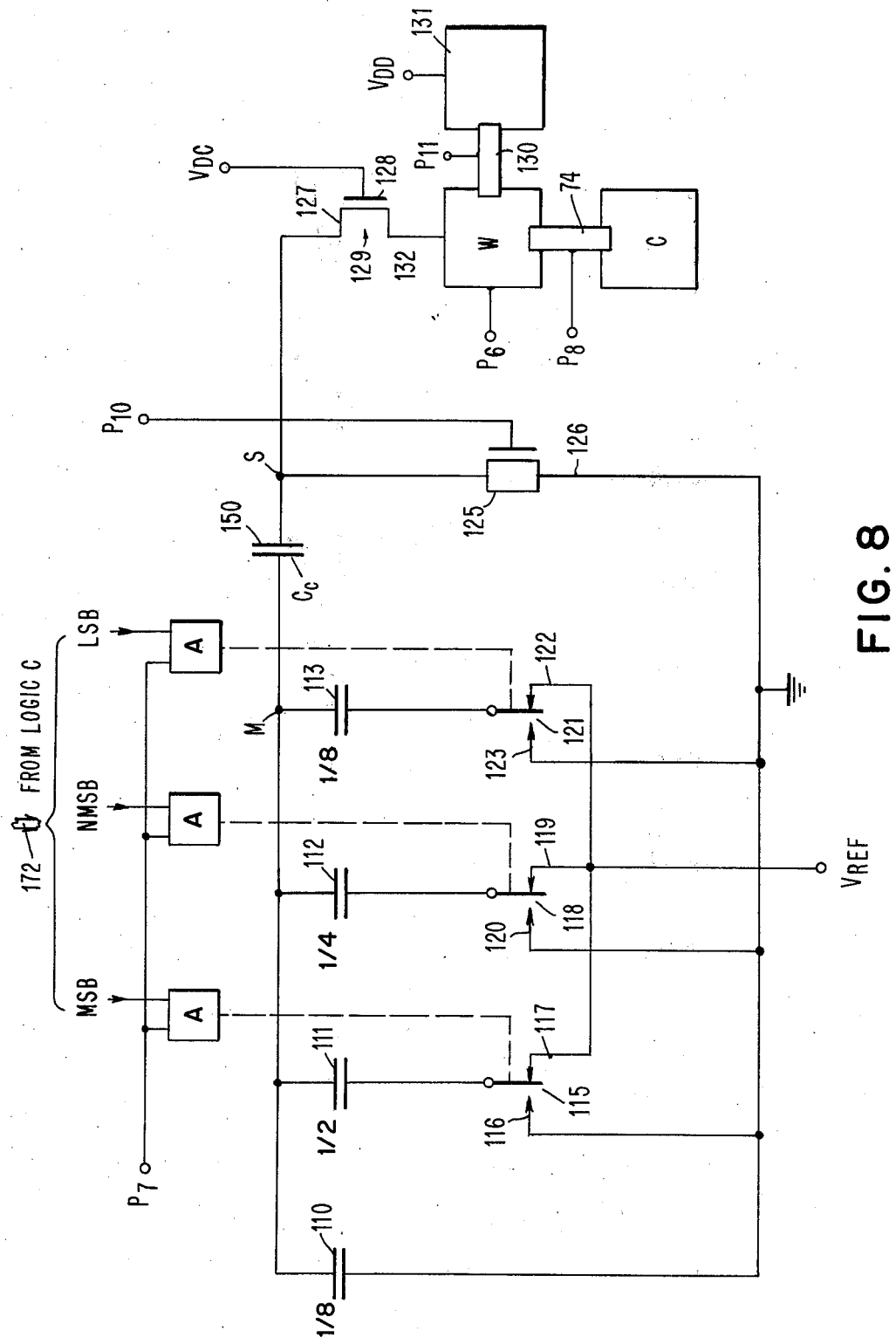
FIG. 8 is an electrical schematic diagram which shows the DAC C circuit of FIG. 1.

FIG. 8 is a schematic diagram of a DAC C which illustrates how a charge packet $Q_{DAC\ C}$ is generated as a function of the digital (binary) inputs which in turn were generated by logic C. DAC C employs a network consisting of binary-weighted capacitors 110, 111, 112, and 113 having relative capacitances of $\frac{1}{8}$, $\frac{1}{2}$, $\frac{1}{4}$, and $\frac{1}{8}$ respectively. Associated switching elements 115, 118, and 121 are controlled by the digital inputs MSB, NMSB and LSB when $P_7$ is positive through the AND gates. Switching elements 115, 118, and 121 are shown as mechanical switches for convenience of illustration although it will be understood that switching circuits such as FET devices are appropriate to this embodiment. Also included in the circuit is capacitor 150, FET device 129, storage electrode W, and its associated transfer electrode 74 which are necessary to transfer charge $Q_{DAC\ C}$ to the well C' below electrode C. A general description of the operation of a two stage weighted DAC system may be found in U.S. Pat. No. 4,077,035 of Y. S. Yee entitled "Two Stage Weighted Capacitor Circuit for Analog-to-Digital and Digital-to-Analog Converters". Working in conjunction with the pipelined sequential successive approximation system, the operation of DAC C is divided into two parts. First, the DAC is initially reset by input $P_7$ from times $t_1$-$t_6$ by the off outputs from the AND gates A which permit the armatures of switches 115, 118, and 121 to connect capacitors 111, 112, and 113 via lines 117, 119, and 122 respectively to positive potential source $V_{REF}$. During this initialization phase, node S is reset to ground by FET device 125, connected by line 126 to ground by input $P_{10}$ from $t_1$ to $t_2$. Node S is then precharged to one threshold voltage $V_t$ below the gate potential $V_{DC}$ via the FET device 129 (operating in the bucket brigade mode as in U.S. Pat. No. 4,035,667 of L. G. Heller entitled "Input Circuits for Inserting Charge Packets Into a Charge-Transfer-Device"), line 132, electrode W, transfer electrode 130, N+diffusion 131 from the potential source $V_{DD}$ during time $t_3$ to $t_6$ in response to input $P_{11}$ on electrode 130. $P_{11}$ goes low at time $t_6$ to turn off electrode 130, isolating the $V_{DD}$ source and completing the precharge operation. At $t_6$ time, the precharge operation is completed and the DAC C circuit is ready to produce charge $Q_{DAC\ C}$ to be sent to the electrode C for comparison with $Q_n$.

To produce the required charge $Q_{DAC\ C}$, logic C in FIG. 1 provides the DAC input combination as provided in Table I above. Raising $P_7$ at time $t_6$ permits the DAC inputs (MSB, NMSB and LMSB) to pass the AND gates A and to operate the appropriate switches 115, 118 and 121. A switch is operated if the corresponding input is a "1" and is not operated if it is a "0". The resultant switching of the appropriate capacitors 111, 112 and 113 as a function of the digital inputs produces charge $Q_{DAC\ C}$ (see Heller). The operation of the DAC by switching the appropriate capacitors from the $V_{REF}$ position to ground causes node M to drop to a lower potential by an amount $\Delta V_M$ which is proportional to the digital inputs, such that $Q_{DAC\ C} = C_c \Delta V_M$, and is therefore proportional to the analog value of the digital inputs as given by Table II. Device 129, originally off, turns on at $t_6$ in response to the negative $\Delta V_M$ to charge node S back to the essentially off state and the associated charge packet $Q_{DAC\ C}$ is collected in potential well W' under electrode W. Pulsing $P_8$ on between $t_{10}$ to $t_{11}$ to lower the potential barrier under transfer electrode 74 and dropping $P_6$ between $t_{10}$ and $t_{11}$ forces the charge packet $Q_{DAC\ C}$ to flow from potential well W' to potential well C' under electrode C where the comparison operation, part of the pipelined sequential successive approximation A/D function, is performed as described previously.

Figure 6:
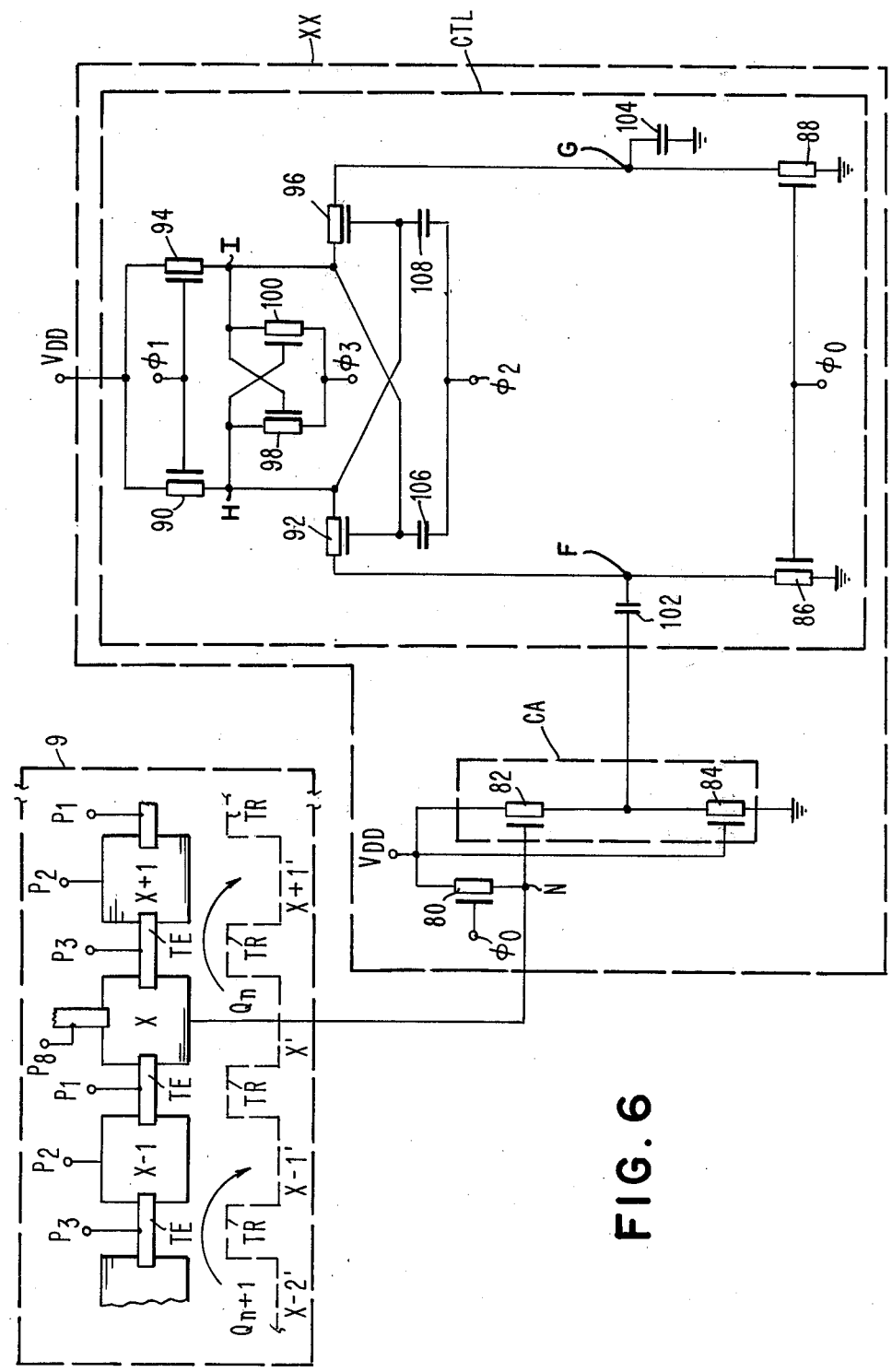
FIG. 6 is an electrical schematic diagram of a comparator circuit in part, a segment of FIG. 4 in part, and a schematic representation of CCD potential wells in part.

Referring to FIG. 6 and the associated timing diagram FIG. 7, the operation of the comparator circuit is divided into two distinct phases. The first is the precharge phase and the second is the comparison phase. During the precharge phase $\phi_0$ rises high and FET device 80 in comparator XX (representative of COMPARATORS AA, BB, and CC) sets the bias point. Clock $\phi_0$ also resets nodes F and G of the cross-coupled charge transfer latch CTL via the devices 86 and 88.

Latch CTL, as in U.S. Pat. No. 4,039,861 of L. G. Heller et al entitled "Cross-Coupled Charge Transfer Sense Amplifier Circuits", includes FET devices 90, 94, 92, 96, 98, 100, 86 and 88 as well as capacitors 102, 106, 104 and 108. Latch CTL is connected to the output of charge amplifier CA. Charge packet $Q_n$, which is to be compared with charge packet $Q_{DAC\,X}$, representative of charge packets $Q_{DAC\,A}$, $Q_{DAC\,B}$, and $Q_{DAC\,C}$, is placed in well X' which represents any one of wells A', B' and C'. When $\phi_0$ drops at time $t_4$ node N and electrode X representative of electrodes A, B, and C of pipeline 9 become electrically floating. Clock signal $\phi_1$ precharges nodes F and G (from $t_3$ to about $t_6$) via FET devices 90 and 92 for node F and FET devices 94 and 96 for node G. The transient created through device 80 by clock signal $\phi_0$ going off at time $t_4$ is absorbed by the precharging action at node F. At the end of the precharging operation, the charge amplifier CA is biased, the latch CTL is critically balanced in the sense that the nodes F and G are each precharged to one threshold below the gate voltages of devices 92 and 96 respectively so that devices 92 and 96 are just at cutoff, and charge packet $Q_n$ is in the CCD well X'.

To perform the comparison operation, charge $Q_n$ is then transferred out of well X' when $P_2$ and $P_3$ are up between times $t_6$ and $t_8$, creating a positive voltage proportional to charge $Q_n$. Then $Q_{DAC\,X}$ is transferred into well X' from DAC X when $P_3$ goes on at $t_{10}$ and off at $t_{11}$, creating a negative voltage transient proportional to $Q_{DAC\,X}$ to produce a difference signal at the input node N. Devices 82 and 84 operate as a source follower, resulting in an attenuated difference signal at the output of the charge amplifier CA. This attenuated difference signal is coupled to node F through capacitor 102. Although the difference signal voltage at node F is less than the difference signal at node N, charge amplification is achieved because the capacitance of node F can be made larger than that of node N.

The positive-going ramp of clock signal $\phi_2$ at $t_{12}$ amplifies the signal charge placed in node F and develops an amplified difference signal between nodes H and I. A positive signal at node F will result in a positive voltage on node H with respect to node I, $V_{HI}$, and a negative signal results in a negative voltage.

The falling edge of clock signal $\phi_3$ between $t_{13}$ and $t_{14}$ and the rising edge of $\phi_1$ at time $t_{14}$ causes the cross-coupled charge transfer latch CTL to go into one of its two stable states, depending upon the polarity of $V_{HI}$. Normal logic levels are attainable at nodes H and I. Since a positive transient, as a result of $Q_n$ transferring out, is always experienced first at node F, premature latchup of the comparator cannot occur since FET device 92 operates in the bucket brigade device mode.

Industrial Applicability

This system provides conversion of analog signals to digital representation. For example, telephone signal processing equipment requires such systems. It is also widely applicable to industrial applications as described in "Electronic Analog/Digital Conversions" by Herman Schmid, Van Nostrand Reinhold Company 1970.

Having thus described out invention, what we claim as new and desire to secure by Letters Patent is:

1. An analog-to-digital signal conversion system comprising:
    an input for analog signal quantities of electrical charge, an analog signal pipeline circuit having a plurality of analog data temporary storage positions A,B . . . X where X represents the number of said storage positions arranged serially from higher to lower order positions with respect to proximity to said input,
    means for moving said quantities of charge serially sequentially down the pipeline from the higher order ones, A,B . . . of said temporary storage positions to the lower order ones B, . . . X of said temporary storage positions, said quantities passing from stage to stage of said pipeline in delay time D,
    a plurality of comparison circuits AA, BB . . . XX ranging from higher to lower order positions with one thereof being coupled to each of said temporary storage positions,
    at least one reference signal source adapted for producing reference signals A,B . . . X with one associated with each of said storage positions A,B . . . X,
    means for coupling said reference signals A',B . . . X' from said reference signals source to said comparison circuits A to AA, B to BB . . . and X to XX,
    said reference signal source including logic DAC means for generating said reference signals A',B' . . . X' from said reference signal source,
    said logic DAC means having a plurality of sets of input units B" . . . X" with each thereof being connected to each of the outputs of the higher order ones of said comparison circuits through delay circuits providing delay times D multiplied as a function of the number of positions separating lower order ones of said sets of inputs B" . . . X" from higher order ones of said storage positions A,B, . . . X−1 so that a reference signal supplied to each analog data temporary storage position depends upon the outputs obtained from the higher order comparison circuits for a particular analog signal quantity passing through said pipeline circuit,
    clock means for timing coupling by said means for coupling from a said reference signal source to a said comparison circuit in phased relationship with provision of corresponding analog signal quantity from said pipeline to said comparison circuit with delay time D between, and
    output lines connected to provide the digital outputs of said conversion system being connected to the outputs of said comparators AA,BB . . . XX through said delay circuits,
    said analog signal quantities comprise charge packets and said comparision connections couple said charge packets to said comparison means, and said control and quantification means provides reference charge packets to said comparison circuits,
    and said reference charge packets are coupled to said comparison circuits through said storage positions.

* * * * *